(12) United States Patent
Qi et al.

(10) Patent No.: US 11,061,428 B2
(45) Date of Patent: Jul. 13, 2021

(54) METHOD AND DEVICE FOR RECONSTRUCTING FIELD SOURCE OF ARRAY ANTENNA BASED ON DIPOLES

(71) Applicant: GENERAL TEST SYSTEMS INC., Shenzhen (CN)

(72) Inventors: Yihong Qi, Shenzhen (CN); Jun Fan, Shenzhen (CN)

(73) Assignee: GENERAL TEST SYSTEMS INC., Shenzhen (CN)

( * ) Notice: Subject to any disclaimer, the term of this patent is extended or adjusted under 35 U.S.C. 154(b) by 391 days.

(21) Appl. No.: 16/034,546

(22) Filed: Jul. 13, 2018

(65) Prior Publication Data

US 2019/0027836 A1   Jan. 24, 2019

(30) Foreign Application Priority Data

Jul. 21, 2017 (CN) .......................... 201710602701.6

(51) Int. Cl.
| | | |
|---|---|---|
| *G06F 1/00* | (2006.01) | |
| *G01R 29/10* | (2006.01) | |
| *H01Q 21/29* | (2006.01) | |
| *H01Q 1/38* | (2006.01) | |
| *H01Q 21/06* | (2006.01) | |
| *H04B 7/04* | (2017.01) | |

(52) U.S. Cl.
CPC .............. *G06F 1/00* (2013.01); *G01R 29/10* (2013.01); *H01Q 21/29* (2013.01)

(58) Field of Classification Search
CPC ......... H01Q 21/06; H01Q 21/29; G01R 29/10
See application file for complete search history.

(56) References Cited

U.S. PATENT DOCUMENTS

2005/0099353 A1* 5/2005 Jones .................. H01Q 1/28
343/795

OTHER PUBLICATIONS

Z. Yu et al., "An Improved Dipole-Moment Model Based on Near-Field Scanning for Characterizing Near-Field Coupling and Far-Field Radiation From an IC," in IEEE Transactions on Electromagnetic Compatibility, vol. 55, No. 1, pp. 97-108, Feb. 2013, doi: 10.1109 (Year: 2013).*

(Continued)

*Primary Examiner* — Omar F Fernandez Rivas
*Assistant Examiner* — Pursottam Giri
(74) *Attorney, Agent, or Firm* — Hodgson Russ LLP

(57) ABSTRACT

Provided are a method and device for reconstructing a field source of an array antenna based on dipoles. The method includes: S1, measuring a radiation field of the array antenna; S2, obtaining a first initial reconstruction array X; S3, constructing a first transmission matrix T; S4, performing an iterative calculation to obtain a first final reconstruction array X'; S5, obtaining a second initial reconstruction array Y; S6, constructing a second transmission matrix T'; and S7, performing an iterative calculation to obtain a second final reconstruction array Y'. The device includes a measuring unit, a reconstruction plane determining unit, a first initial reconstructing unit, a first transmission matrix constructing unit, a first final reconstructing unit, a second initial reconstructing unit, a second transmission matrix constructing unit, and a second final reconstructing unit.

19 Claims, 3 Drawing Sheets

(56) References Cited

OTHER PUBLICATIONS

Ren, Xiao, "A new equivalent dipole-moment source reconstruction method for IC radiated emissions based on near-field scanning" (2015). Masters Theses. 7477. https://scholarsmine.mst.edu/masters_theses/7477 (Year: 2015).*

M. Serhir, P. Besnier and M. Drissi, "Antenna Modeling Based on a Multiple Spherical Wave Expansion Method: Application to an Antenna Array," in IEEE Transactions on Antennas and Propagation, vol. 58, No. 1, pp. 51-58, Jan. 2010, doi: 10.1109/TAP.2009.2036284. (Year: 2010).*

B. Ravelo, "Non-unicity of the electric near-field planar emission model with dipole array," in IET Microwaves, Antennas & Propagation, vol. 11, No. 5, pp. 584-592, 15 4 2017, doi: 10.1049/iet-map.2016.0910. (Year: 2017).*

Z. Mengze, Y. Zhaowen and X. Ying, "A near-field to far-field transformation method research based on interference source reconstruction," 2014 XXXIth URSI General Assembly and Scientific Symposium (URSI GASS), Beijing, 2014, pp. 1-4, doi: 10.1109/URSIGASS.2014.6929543. (Year: 2014).*

* cited by examiner

METHOD AND DEVICE FOR RECONSTRUCTING FIELD SOURCE OF ARRAY ANTENNA BASED ON DIPOLES

CROSS-REFERENCE TO RELATED APPLICATION

This application claims priority to and benefits of Chinese Patent Application Serial No. 201710602701.6, filed with the State Intellectual Property Office of P. R. China on Jul. 21, 2017, the entire content of which is incorporated herein by reference.

FIELD

The present disclosure relates to the field of antenna technology, and more particularly to a method and device for reconstructing a field source of an array antenna based on dipoles.

BACKGROUND

Antenna is a necessary device to effectively radiate and receive radio waves, and is widely used in radio systems such as communication, broadcasting, television, radar and navigation, etc.

Array antenna is such an antenna that is constituted by at least two array elements arranged regularly or randomly and is properly excited to obtain predetermined radiation characteristics. In recent years, the array antenna as an important development direction of civil and military antenna technologies has attracted much attention.

Antenna pattern is an important technical parameter of the array antenna. The performance of the array antenna is influenced by the failure and error of the array element to a large extent, the increase of active components will increase the failure rate, and manufacturing tolerances and mechanical deformations of components will also cause a distortion of the radiation pattern. In order to restore the performance of the antenna, measurements and calibrations need to be done to find out the array element where failure or error occurs to make compensation or replacement. Therefore, it is particularly important to measure the antenna pattern, and the quick and accurate measurement of the antenna pattern will be of great help to calibration, precision analysis and even design and improvement of the antenna.

Traditional measurement methods of the array antenna pattern can be classified into a far-field measurement and a near-field measurement according to test area. With the far-field measurement, the pattern can be directly measured, but requirements for conditions of a testing site are very high, and it is almost impossible to have a suitable measuring space for a high frequency range. The near-field measurement uses a probe to scan an antenna aperture to measure amplitudes and phases at the aperture, and then converts near-field data into far-field data. The near-field measurement includes: a field source distribution method, a near-field scanning technique, a compensated compact range (CCR) technology, a focusing method and an extrapolation method, each of which has its advantages and disadvantages and adaptability. Further, a method for reconstructing an equivalent radiation source through dipoles with the use of near-field measurement data is proposed, with this method, an equivalent dipole array may be reconstructed no matter how complex an internal structure of a device under test is, thereby solving a problem that a full wave simulation cannot be performed with a simulation software on a complex device under test. However, this method also has drawbacks. On the one hand, in the near-field measurement, the coupling of the probe to an antenna under test has great influence on the measurement, and compensation of the probe needs to be calculated in the later stage, which leads the data processing very complicated. On the other hand, the array antenna under test is regarded as an unknown "black box" in reconstruction, and an equivalent radiation source reconstructed thereby cannot reflect the real array antenna, which has no practical guiding significance for the development and production of the array antenna.

SUMMARY

Embodiments of the present disclosure seek to solve at least one of the problems existing in the related art to at least some extent.

According to embodiments of a first aspect of the present disclosure, a method for reconstructing a field source of an array antenna based on dipoles is provided, including:

S1, measuring a radiation field of the array antenna at N measuring points to obtain a data matrix F, where the N measuring points are located at a radiation near-field or a radiation medium-field of the array antenna;

S2, defining a virtual plane consistent with a radiation aperture of the array antenna as a total reconstruction plane, and defining virtual planes consistent with aperture fields of individual array elements of the array antenna as reconstruction planes of array elements;

placing at least one dipole in the reconstruction plane of each array element to constitute a first initial reconstruction array X;

S3, constructing a first transmission matrix T such that T·X=F, wherein the first transmission matrix T is determined by a frequency of the array antenna, positions of the dipoles in the first initial reconstruction array X and positions of the N measuring points;

S4, performing an iterative calculation according to a first target function $\mu_{tot}$ where parameters of the dipoles are changed in each iteration, and obtaining a first final reconstruction array X' when the $\mu_{tot}$ is less than a first preset value;

S5, supplementing dipoles in the total reconstruction plane on the basis of the first final reconstruction array X' to constitute a second initial reconstruction array Y;

S6, constructing a second transmission matrix T' such that T'·Y=F, wherein the second transmission matrix T' is determined by the frequency of the array antenna, positions of the dipoles in the second initial reconstruction array Y and the positions of the N measuring points; and S7, performing an iterative calculation according to a second target function $\mu'_{tot}$ where parameters of the dipoles are changed in each iteration, and obtaining a second final reconstruction array Y' when the $\mu'_{tot}$ is less than a second preset value.

According to embodiments of a second aspect of the present disclosure, a device for reconstructing a field source of an array antenna based on dipoles is provided, including:

a measuring unit, configured to measure a radiation field of the array antenna at N measuring points and record position information of the N measuring points to obtain a data matrix F, where the N measuring points are located at a radiation near-field or a radiation medium-field of the array antenna;

a reconstruction plane determining unit, configured to determine a total reconstruction plane and reconstruction planes of array elements, where a virtual plane consistent with a radiation aperture of the array antenna is defined as the total reconstruction plane, and virtual planes consistent with aperture fields of individual array elements of the array antenna are defined as the reconstruction planes of array elements;

a first initial reconstructing unit, configured to place at least one dipole in the reconstruction plane of each array element to constitute a first initial reconstruction array X;

a first transmission matrix constructing unit, configured to construct a first transmission matrix T such that T·X=F, wherein the first transmission matrix T is determined by a frequency of the array antenna, positions of the dipoles in the first initial reconstruction array X and positions of the N measuring points;

a first final reconstructing unit, configured to perform an iterative calculation according to a first target function $\mu_{tot}$ where parameters of the dipoles are changed in each iteration, and to obtain a first final reconstruction array X' when the $\mu_{tot}$ is less than a first preset value;

a second initial reconstructing unit, configured to supplement dipoles in the total reconstruction plane on the basis of the first final reconstruction array X' to constitute a second initial reconstruction array Y;

a second transmission matrix constructing unit, configured to construct a second transmission matrix T' such that T'·Y=F, wherein the second transmission matrix T' is determined by the frequency of the array antenna, positions of the dipoles in the second initial reconstruction array Y and the positions of the N measuring points; and a second final reconstructing unit, configured to perform an iterative calculation according to a second target function $\mu_{tot}$ where parameters of the dipoles are changed in each iteration, and to obtain a second final reconstruction array Y' when the $\mu'_{tot}$ is less than a second preset value.

According to embodiments of a third aspect of the present disclosure, a device for reconstructing a field source of an array antenna based on dipoles is provided. The device includes a processor; and a memory for storing instructions executable by the processor; in which the processor is configured to perform the method for reconstructing a field source of an array antenna based on dipoles as described above.

According to embodiments of a fourth aspect of the present disclosure, there is provided a non-transitory computer-readable storage medium having stored therein instructions that, when executed by a processor of a terminal, causes the terminal to perform the method for reconstructing a field source of an array antenna based on dipoles as described above.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
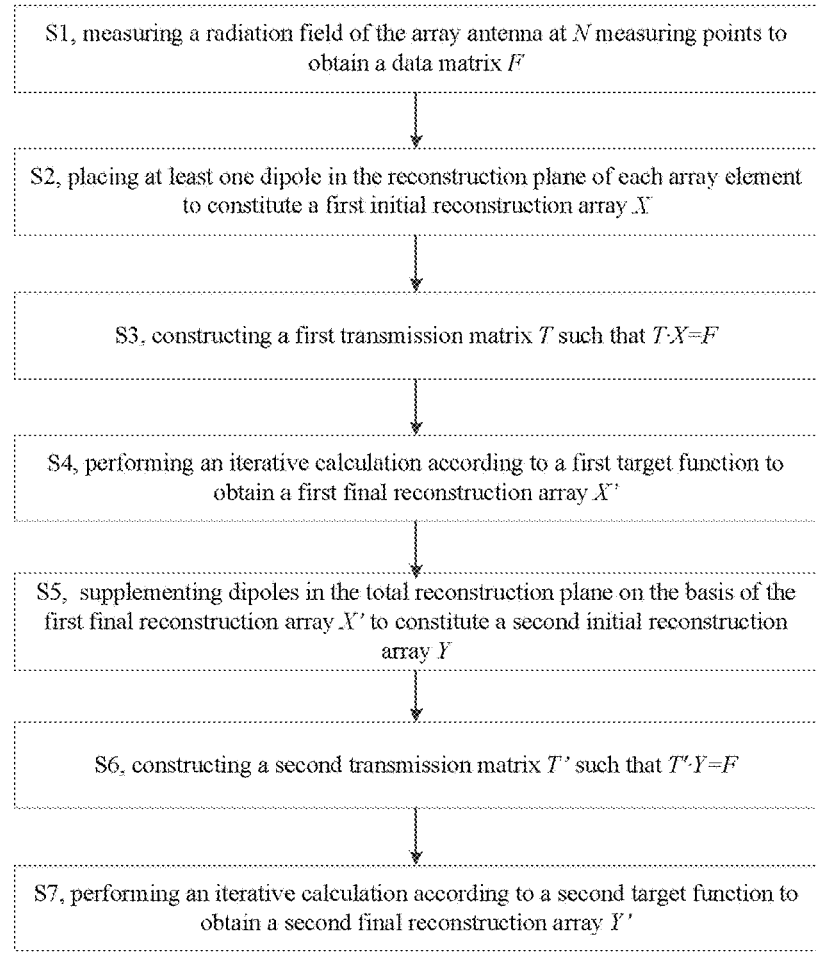
FIG. 1 is a flow chart of a method for reconstructing a field source of an array antenna based on dipoles according to embodiments of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In addition, terms such as "first" and "second" are used herein for purposes of description and are not intended to indicate or imply relative importance or significance or to imply the number of indicated technical features. Thus, the feature defined with "first" and "second" may comprise one or more selected from this feature. In the description of the present invention, the phrase of "a plurality of" means two or more than two, unless specified otherwise.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

According to embodiments of a first aspect of the present disclosure, a method for reconstructing a field source of an array antenna based on dipoles is provided, including:

S1, measuring a radiation field of the array antenna at N measuring points to obtain a data matrix F, where the N measuring points are located at a radiation near-field or a radiation medium-field of the array antenna;

S2, defining a virtual plane consistent with a radiation aperture of the array antenna as a total reconstruction plane, and defining virtual planes consistent with aperture fields of individual array elements of the array antenna as reconstruction planes of array elements;

placing at least one dipole in the reconstruction plane of each array element to constitute a first initial reconstruction array X;

S3, constructing a first transmission matrix T such that T·X=F, wherein the first transmission matrix T is determined by a frequency of the array antenna, positions of the dipoles in the first initial reconstruction array X and positions of the N measuring points;

S4, performing an iterative calculation according to a first target function $\mu_{tot}$ where parameters of the dipoles are changed in each iteration, and obtaining a first final reconstruction array X' when the $\mu_{tot}$ is less than a first preset value;

S5, supplementing dipoles in the total reconstruction plane on the basis of the first final reconstruction array X' to constitute a second initial reconstruction array Y;

S6, constructing a second transmission matrix T' such that T'·Y=F, wherein the second transmission matrix T' is determined by the frequency of the array antenna, positions of the dipoles in the second initial reconstruction array Y and the positions of the N measuring points; and S7, performing an iterative calculation according to a second target function $\mu'_{tot}$ where parameters of the dipoles are changed in each iteration, and obtaining a second final reconstruction array Y' when the $\mu'_{tot}$ is less than a second preset value.

In embodiments of the present disclosure, the parameters of the dipoles in S4 and S7 include at least one or more selected from the number of the dipoles, the positions of the dipoles or a polarization mode of the dipoles.

In embodiments of the present disclosure, the first target function is $$\mu_{tot} = \sum_{i=0}^{n} \left| \frac{F - (T_i \cdot X_i)}{F} \right|.$$

In embodiments of the present disclosure, the second target function is $$\mu'_{tot} = \sum_{i=0}^{n} \left| \frac{F - (T'_i \cdot Y_i)}{F} \right|.$$

In embodiments of the present disclosure, in S2, one dipole is placed in the reconstruction plane of each array element to constitute the first initial reconstruction array X.

In embodiments of the present disclosure, in each iteration, relative positions among individual dipoles remain unchanged.

According to embodiments of a second aspect of the present disclosure, a device for reconstructing a field source of an array antenna based on dipoles is provided, including:

a measuring unit, configured to measure a radiation field of the array antenna at N measuring points and record position information of the N measuring points to obtain a data matrix F, where the N measuring points are located at a radiation near-field or a radiation medium-field of the array antenna;

a reconstruction plane determining unit, configured to determine a total reconstruction plane and reconstruction planes of array elements, where a virtual plane consistent with a radiation aperture of the array antenna is defined as the total reconstruction plane, and virtual planes consistent with aperture fields of individual array elements of the array antenna are defined as the reconstruction planes of array elements;

a first initial reconstructing unit, configured to place at least one dipole in the reconstruction plane of each array element to constitute a first initial reconstruction array X;

a first transmission matrix constructing unit, configured to construct a first transmission matrix T such that T·X=F, wherein the first transmission matrix T is determined by a frequency of the array antenna, positions of the dipoles in the first initial reconstruction array X and positions of the N measuring points;

a first final reconstructing unit, configured to perform an iterative calculation according to a first target function $\mu_{tot}$ where parameters of the dipoles are changed in each iteration, and to obtain a first final reconstruction array X' when the $\mu_{tot}$ is less than a first preset value;

a second initial reconstructing unit, configured to supplement dipoles in the total reconstruction plane on the basis of the first final reconstruction array X' to constitute a second initial reconstruction array Y;

a second transmission matrix constructing unit, configured to construct a second transmission matrix T' such that T'∝·Y=F, wherein the second transmission matrix T' is determined by the frequency of the array antenna, positions of the dipoles in the second initial reconstruction array Y and the positions of the N measuring points; and a second final reconstructing unit, configured to perform an iterative calculation according to a second target function $\mu'_{tot}$ where parameters of the dipoles are changed in each iteration, and to obtain a second final reconstruction array Y' when the $\mu'_{tot}$ is less than a second preset value.

In embodiments of the present disclosure, the parameters of the dipoles in the first final reconstructing unit and the second final reconstructing unit include at least one or more selected from the number of the dipoles, the positions of the dipoles or a polarization mode of the dipoles.

In embodiments of the present disclosure, the first target function is $$\mu_{tot} = \sum_{i=0}^{n} \left| \frac{F - (T'_i \cdot X_i)}{F} \right|.$$

In embodiments of the present disclosure, the second target function is $$\mu'_{tot} = \sum_{i=0}^{n} \left| \frac{F - (T'_i \cdot Y_i)}{F} \right|.$$

In embodiments of the present disclosure, in the first initial reconstructing unit, one dipole is placed in the reconstruction plane of each array element to constitute the first initial reconstruction array X.

In embodiments of the present disclosure, in each iteration, relative positions among individual dipoles remain unchanged.

In the reconstruction of the array antenna according to embodiments of the present disclosure, dipoles are physically constrained according to real geometric features of the array antenna under test and parameters of the array element, the equivalent radiation source reconstructed thereby can truly reflect the array antenna to a certain extent, and thus it is of practical guiding significance for the development and production of the array antenna.

Referring to FIG. 1, a method for reconstructing a field source of an array antenna based on dipoles includes the following operations.

At S1, a radiation field of the array antenna is measured at N measuring points to obtain a data matrix F, where the N measuring points are located at a radiation near-field or a radiation medium-field of the array antenna.

According to the basic knowledge of the antenna, a field of antenna space may be divided into a reactive near-field, a radiation near-field, a radiation medium-field and a radiation far-field. A distance for delimiting the reactive near-field and the radiation near-field is $$R = \frac{\lambda}{2\pi},$$

a distance for delimiting the radiation near-field and the radiation medium-field is $$R = 0.6\sqrt{\frac{D^3}{\lambda}},$$

and a distance for delimiting the radiation medium-field and the radiation far-field is $$R = \frac{2D^2}{\lambda},$$

where R is a distance from the antenna, λ is a wavelength of the antenna, and D is a diameter of the antenna. Alternatively, when sampling and measuring in the radiation medium-field of the array antenna coupling between a probe and the array antenna can be avoided, thereby avoiding tedious calculations in the subsequent data processing. Furthermore, when the measuring points are located in the radiation medium-field of the array antenna, a measurement method may be flexibly chosen according to the antenna array under test, the measurement environment or desired results, and thus adaptability increases. For example, traditional cylindrical sampling, spherical sampling or plane sampling may be adopted, as well other sampling methods, which are not limited in the present disclosure.

Generally, if a rectangular coordinate system is established with the array antenna as an origin, a coordinate of the measuring point is expressed as (x, y, z), the data matrix F is expressed as $$F = \left( \begin{bmatrix} E_x \\ E_y \\ E_z \\ H_x \\ H_y \\ H_z \end{bmatrix} \right)_{N \times 1},$$

where Ex, Ey, Ez represent components of a measuring electric field in directions of an X axis, a Y axis and a Z axis, respectively, and Hx, Hy, Hz represent components of a measuring magnetic field in the directions of the X axis, the Y axis and the Z axis, respectively.

At S2, a virtual plane consistent with a radiation aperture of the array antenna is defined as a total reconstruction plane, virtual planes consistent with aperture fields of individual array elements of the array antenna are defined as reconstruction planes of array elements, and at least one dipole is placed in the reconstruction plane of each array element to constitute a first initial reconstruction array X. The physical significance of this operation is to reconstruct the individual array elements of the array antenna with dipoles.

For an array antenna with A array elements, there are A reconstruction planes. It is assumed that the number of the dipoles in the first initial reconstruction array X is B, then B≥A, a coordinate of the dipole is expressed as (x', y', z'), and the first initial reconstruction array X is expressed as $$X = \left( \begin{bmatrix} J_x \\ J_y \\ J_z \\ M_x \\ M_y \\ M_z \end{bmatrix} \right)_{B \times 1},$$

where Jx, Jy, Jz represent electric-field components of the dipole in the directions of the X axis, the Y axis and the Z axis, respectively, and Mx, My, Mz represent magnetic-field components of the dipole in the directions of the X axis, the Y axis and the Z axis, respectively.

It should be illustrated that, in order to simplify the calculation, alternatively, in this operation, one dipole can be placed in the reconstruction plane of each array element, then B=A.

At S3, a first transmission matrix T is constructed such that T·X=F. Therefore, the first initial reconstruction array X is X=(T$^T$T)$^{-1}$T$^T$F. A function of the first transmission matrix T is to establish a relationship between the data matrix F and the first initial reconstruction array X, and the first transmission matrix T is determined by a frequency of the array antenna, positions of the dipoles in the first initial reconstruction array X and positions of the N measuring points. Specifically, relationships among the data matrix F, the first transmission matrix T and the first initial reconstruction array X may be expressed as follows:

$$E_x = E_{Fx} + E_{Ax};$$
$$E_y = E_{Fy} + E_{Ay};$$
$$E_z = E_{Fz} + E_{Az};$$

$$E_{Fx} = -\frac{1}{4\pi} \int\int\int_V [(z-z')M_y - (y-y')M_z] \frac{1+j\beta R}{R^3} e^{-j\beta R} dx' dy' dz',$$

where $E_{Fx}$ represents an electric-field component in the direction of the X axis generated at the measuring point by the magnetic-field components of the dipole in the directions of the Y axis and the Z axis;

$$E_{Fy} = -\frac{1}{4\pi} \int\int\int_V [(x-x')M_z - (z-z')M_x] \frac{1+j\beta R}{R^3} e^{-j\beta R} dx' dy' dz',$$

where $E_{Fy}$ represents an electric-field component in the direction of the Y axis generated at the measuring point by the magnetic-field components of the dipole in the directions of the X axis and the Z axis;

$$E_{Fz} = -\frac{1}{4\pi}\int\int\int_V [(y-y')M_y - (x-x')M_y]\frac{1+j\beta R}{R^3}e^{-j\beta R}dx'dy'dz',$$

where $E_{FZ}$ represents an electric-field component in the direction of the Z axis generated at the measuring point by the magnetic-field components of the dipole in the directions of the X axis and the Y axis;

$$E_{Ax} = \\ -\frac{j\eta}{4\pi\beta}\int\int\int_V \{G_1 J_x + (x-x')G_2 \times [(x-x')J_x + (y-y')J_y + (z-z')J_z]\} \\ e^{-j\beta R}dx'dy'dz',$$

where $E_{Ax}$ represents an electric-field component in the direction of the X axis generated at the measuring point by the electric-field components of the dipole in the directions of the X axis, the Y axis and the Z axis;

$$E_{Ay} = \\ -\frac{j\eta}{4\pi\beta}\int\int\int_V \{G_1 J_x + (y-y')G_2 \times [(x-x')J_x + (y-y')J_y + (z-z')J_z]\} \\ e^{-j\beta R}dx'dy'dz',$$

where $E_{Ay}$ represents an electric-field component in the direction of the Y axis generated at the measuring point by the electric-field components of the dipole in the directions of the X axis, the Y axis and the Z axis;

$$E_{Az} = \\ -\frac{j\eta}{4\pi\beta}\int\int\int_V \{G_1 J_z + (z-z')G_2 \times [(x-x')J_x + (y-y')J_y + (z-z')J_z]\} \\ e^{-j\beta R}dx'dy'dz',$$

where $E_{Az}$ represents an electric-field component in the direction of the Z axis generated at the measuring point by the electric-field components of the dipole in the directions of the X axis, the Y axis and the Z axis;

$$H_x = H_{Ax} + H_{Fx};$$
$$H_y = H_{Ay} + H_{Fy};$$
$$H_z = H_{Az} + H_{Fz};$$

$$H_{Ax} = -\frac{1}{4\pi}\int\int\int_V [(z-z')J_y - (y-y')J_z]\frac{1+j\beta R}{R^3}e^{-j\beta R}dx'dy'dz',$$

where $H_{Ax}$ represents a magnetic-field component in the direction of the X axis generated at the measuring point by the electric-field components of the dipole in the directions of the Y axis and the Z axis;

$$H_{Ay} = \frac{1}{4\pi}\int\int\int_V [(x-x')J_z - (z-z')J_x]\frac{1+j\beta R}{R^3}e^{-j\beta R}dx'dy'dz',$$

where $H_{Ay}$ represents a magnetic-field component in the direction of the Y axis generated at the measuring point by the electric-field components of the dipole in the directions of the X axis and the Z axis;

$$H_{Az} = \frac{1}{4\pi}\int\int\int_V [(y-y')J_x - (x-x')J_y]\frac{1+j\beta R}{R^3}e^{-j\beta R}dx'dy'dz',$$

where $H_{Az}$ represents a magnetic-field component in the direction of the Z axis generated at the measuring point by the electric-field components of the dipole in the directions of the X axis and the Y axis;

$$H_{Fx} = -\frac{j}{4\pi\beta\eta}$$
$$\int\int\int_V \{G_1 M_x + (x-x')G_2 \times [(x-x')M_x + (y-y')M_y + (z-z')M_z]\} \\ e^{-j\beta R}dx'dy'dz',$$

where $H_{Fx}$ represents a magnetic-field component in the direction of the X axis generated at the measuring point by the magnetic-field components of the dipole in the directions of the X axis, the Y axis and the Z axis;

$$H_{Fy} = -\frac{j}{4\pi\beta\eta}$$
$$\int\int\int_V \{G_1 M_y + (y-y')G_2 \times [(x-x')M_x + (y-y')M_y + (z-z')M_z]\} \\ e^{-j\beta R}dx'dy'dz',$$

where $H_{Fy}$ represents a magnetic-field component in the direction of the Y axis generated at the measuring point by the magnetic-field components of the dipole in the directions of the X axis, the Y axis and the Z axis;

$$H_{Fz} = -\frac{j}{4\pi\beta\eta}$$
$$\int\int\int_V \{G_1 M_y + (z-z')G_2 \times [(x-x')M_x + (y-y')M_y + (z-z')M_z]\} \\ e^{-j\beta R}dx'dy'dz',$$

where $H_{Fz}$ represents a magnetic-field component in the direction of the Z axis generated at the measuring point by the magnetic-field components of the dipole in the directions of the X axis, the Y axis and the Z axis, where $$G1 = \frac{-1 - j\beta R + \beta^2 R^2}{R^3},$$

$$G2 = \frac{3 + 3j\beta R - \beta^2 R^2}{R^5},$$

J is an imaginary unit, $$\eta = \sqrt{\frac{\mu_0 * \mu_r}{\varepsilon_0 * \varepsilon_r}},$$

$\beta = \omega * \sqrt{\mu_0 * \mu_r * \varepsilon_0 * \varepsilon_r}$, $\mu_0$ is a permeability of vacuum, $\mu_r$ is a relative permeability, $\varepsilon_0$ is a vacuum permittivity, $\varepsilon_r$ is a relative permittivity, $\omega$ is an angular frequency, and R is a distance between the measuring point and the dipole.

At S4, an iterative calculation is performed according to a first target function $\mu_{tot}$ where parameters of the dipoles are changed in each iteration, and a first final reconstruction array X' is obtained when the $\mu_{tot}$ is less than a first preset value.

It should be noted that, in this operation, the dipoles should always be in the reconstruction planes of the array elements. The parameters of the dipoles include at least one or more selected from the number of the dipoles, the positions of the dipoles or a polarization mode of the dipoles.

For example, the first target function may be $$\mu_{tot} = \sum_{i=0}^{n} \left| \frac{F - (T_i \cdot Y_i)}{F} \right|,$$

but not limited to this. The iterative calculation may be solved by a genetic algorithm or an annealing algorithm.

It should be illustrated that, in order to simplify the calculation, alternatively, in this operation, relative positions among individual dipoles may remain unchanged in each iteration.

At S5, dipoles are supplemented in the total reconstruction plane on the basis of the first final reconstruction array X' to constitute a second initial reconstruction array Y. The physical significance of this operation is to supplement the reconstruction for the coupling among individual array elements of the array antenna, so as to improve the accuracy of the first final reconstruction array X'.

At S6, a second transmission matrix T' is constructed such that T'·Y=F, where the second transmission matrix T' is determined by the frequency of the array antenna, positions of the dipoles in the second initial reconstruction array Y and the positions of the N measuring points; and relationships among the data matrix F, the second transmission matrix T' and the second initial reconstruction array Y are similar to that described at S3.

At S7, an iterative calculation is performed according to a second target function $\mu'_{tot}$ where parameters of the dipoles are changed in each iteration. When the $\mu'_{tot}$ is less than a second preset value, a second final reconstruction array Y' is obtained. When the second preset value is less than the first preset value described at S4, the second final reconstruction array Y' is more accurate than the first final reconstruction array X'. The parameters of the dipoles include at least one or more selected from the number of the dipoles, positions of the dipoles or a polarization mode of the dipoles.

For example, the second target function may be $$\mu'_{tot} = \sum_{i=0}^{n} \left| \frac{F - (T'_i \cdot Y_i)}{F} \right|,$$

but not limited to this.

The second final reconstruction array Y' obtained according to the present disclosure can be used to quickly and conveniently calculate the pattern of the array antenna at any distance, and the equivalent radiation source reconstructed thereby can truly reflect the array antenna to a certain extent, and thus it is of practical guiding significance for the development and production of the array antenna, for example, for intuitively determining states of individual array elements, diagnosing work situations of individual array elements, and checking errors and so on.

Figure 2:
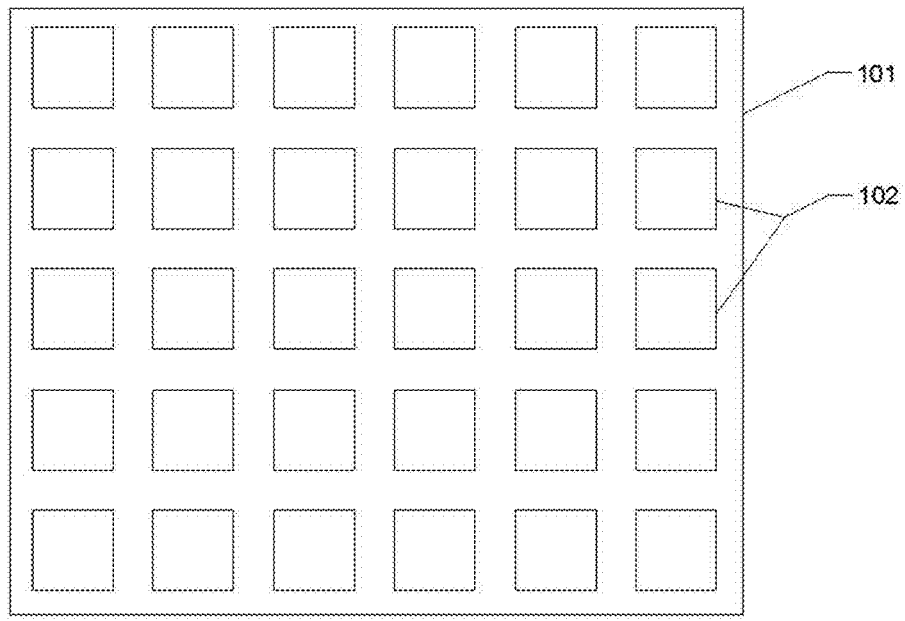
FIG. 2 is a schematic diagram of an aperture of an array antenna according to an embodiment of the present disclosure.

The radiation aperture of the array antenna according to an embodiment of the first aspect of the present disclosure is shown for example in FIG. 2. The radiation aperture 101 of the array antenna includes 5×6 array elements, correspondingly, aperture fields 102 of the 5×6 array elements are shown in FIG. 2.

Figure 3:
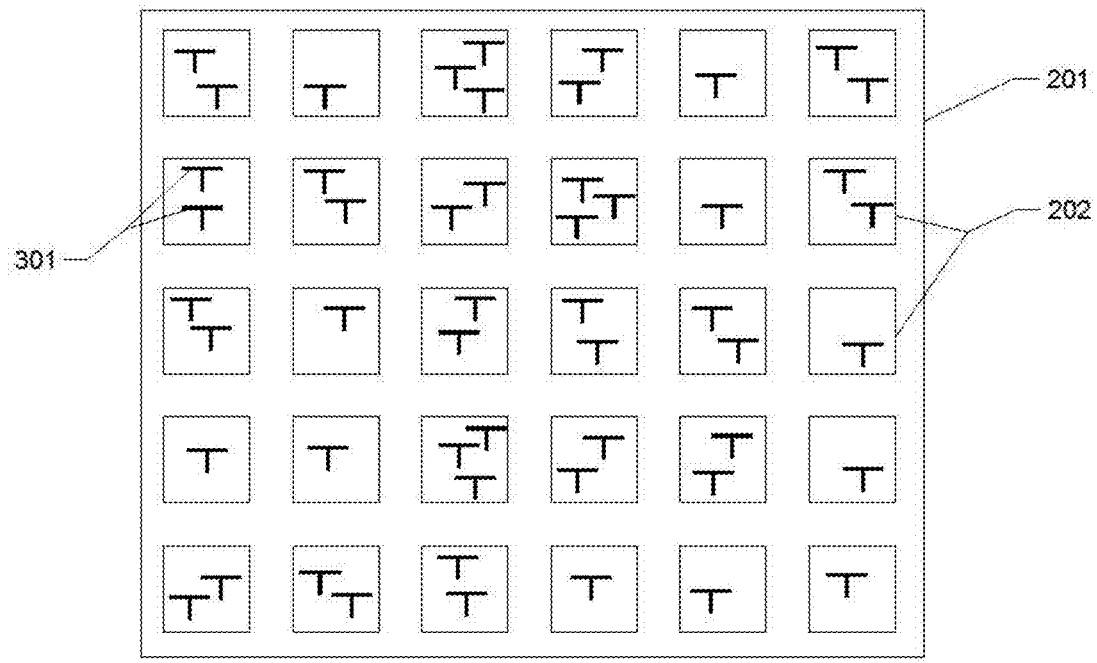
FIG. 3 is a schematic diagram of a first initial reconstruction array X according to an embodiment of the present disclosure.
Figure 4:
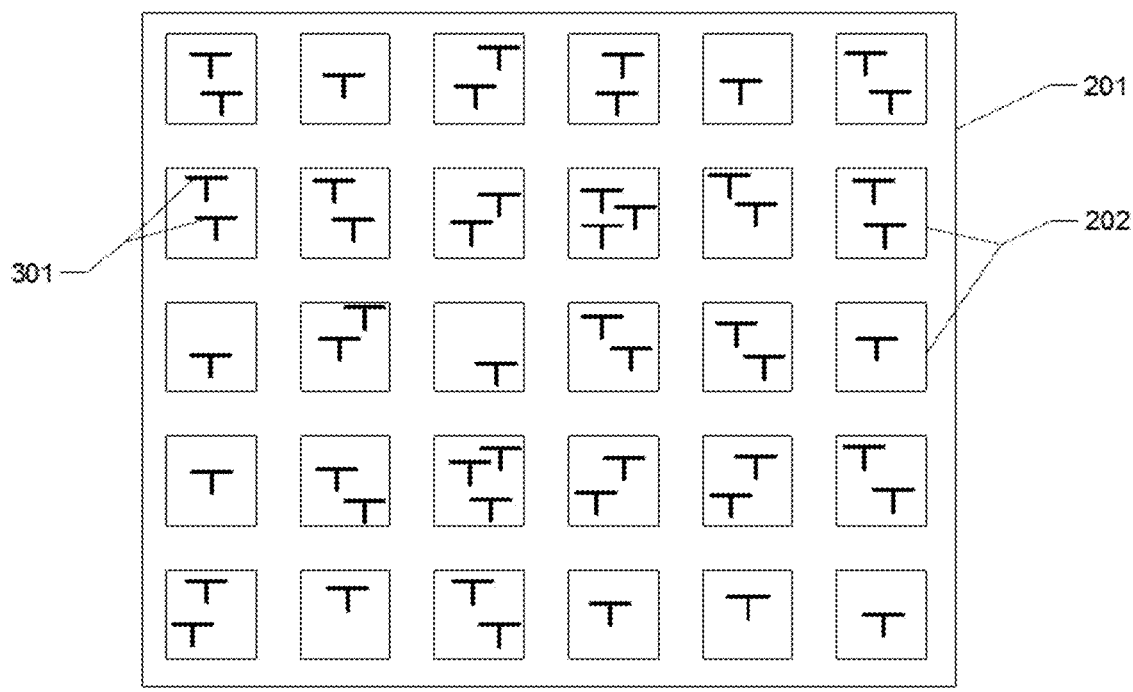
FIG. 4 is a schematic diagram of a first final reconstruction array X' according to an embodiment of the present disclosure.

The first initial reconstruction array X according to an embodiment of the first aspect of the present disclosure is shown for example in FIG. 3, a virtual plane consistent with the radiation aperture 101 of the array antenna shown in FIG. 2 is defined as the total reconstruction plane 201, and virtual planes consistent with aperture fields 102 of individual array elements of the array antenna shown in FIG. 2 are defined as the reconstruction planes 202 of array elements. In this embodiment, dipoles 301 in different number are placed in the reconstruction planes 202 of individual array elements. The first final reconstruction array X' as shown in FIG. 4 is obtained through the iterative calculation according to the first target function.

Figure 5:
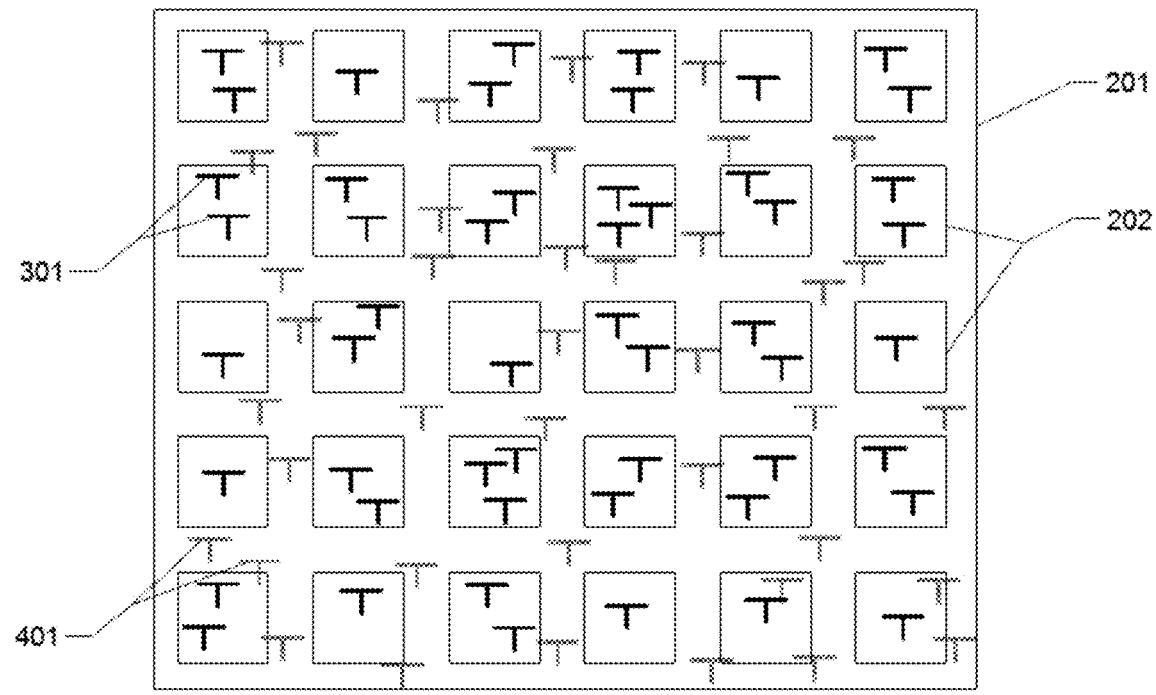
FIG. 5 is a schematic diagram of a second initial reconstruction array Y according to an embodiment of the present disclosure.
Figure 6:
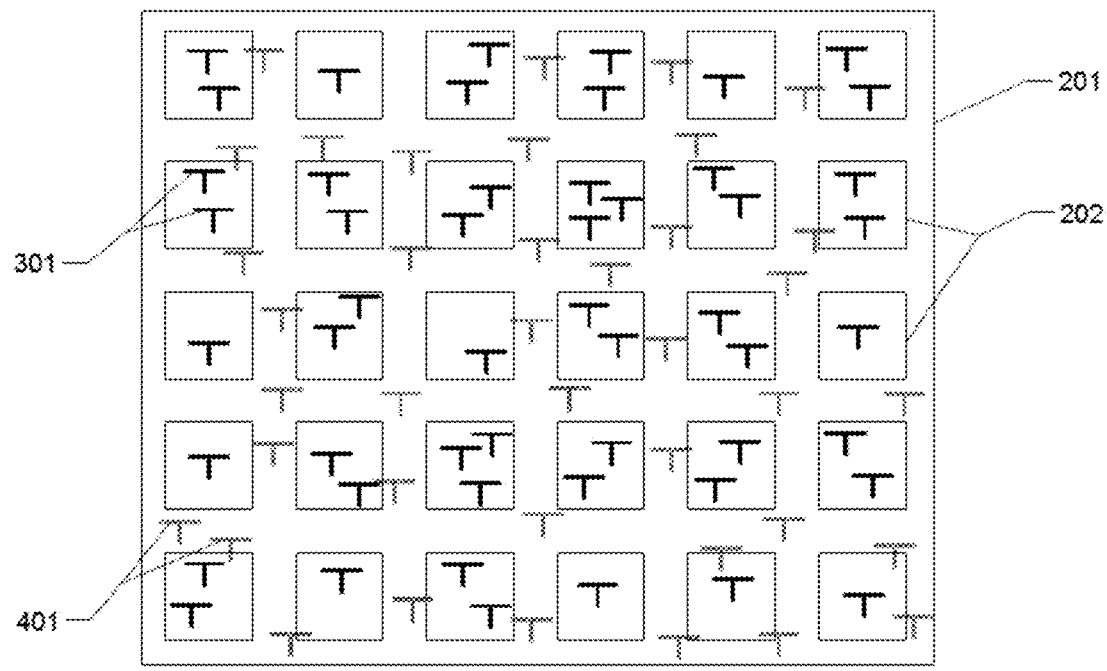
FIG. 6 is a schematic diagram of a second final reconstruction array Y' according to an embodiment of the present disclosure.

The second initial reconstruction array Y according to an embodiment of the first aspect of the present disclosure is shown in FIG. 5, which is constituted by supplementing dipoles 401 in the total reconstruction plane 201 on the basis of the first final reconstruction array X' described above. A part of the supplemented dipoles 401 is located in the reconstruction planes 202 of array elements, and a part of the supplemented dipoles 401 is located between the reconstruction planes 202 of array elements. Through the iterative calculation according to the second target function, the second final reconstruction array Y' as shown in FIG. 6 is obtained. It should be illustrated that, the supplemented dipoles 401 described herein are substantially the same as the dipoles 301 described above, and they are distinguished just for convenience of description.

The composition of the array antenna, the number and positions of the dipoles for reconstruction, etc. described in embodiments of the present disclosure are only illustrative, and used to generally understand the present disclosure. The embodiments shall not be construed to limit the present disclosure.

In embodiments of the second aspect of the present disclosure, a device for reconstructing a field source of an array antenna based on dipoles is provided. The device includes: a measuring unit, a reconstruction plane determining unit, a first initial reconstructing unit, a first transmission matrix constructing unit, a first final reconstructing unit, a second initial reconstructing unit, a second transmission matrix constructing unit, and a second final reconstructing unit.

The measuring unit is configured to measure a radiation field of the array antenna at N measuring points and record position information of the N measuring points to obtain a data matrix F, where the N measuring points are located at a radiation near-field or a radiation medium-field of the array antenna.

The reconstruction plane determining unit is configured to determine a total reconstruction plane and reconstruction planes of array elements, where a virtual plane consistent with a radiation aperture of the array antenna is defined as the total reconstruction plane, and virtual planes consistent with aperture fields of individual array elements of the array antenna are defined as the reconstruction planes of array elements.

The first initial reconstructing unit is configured to place at least one dipole in the reconstruction plane of each array element to constitute a first initial reconstruction array X. Alternatively, in order to simplify the calculation, in this unit, one dipole may be placed in the reconstruction plane of each array element.

The first transmission matrix constructing unit is configured to construct a first transmission matrix T such that T·X=F, where the first transmission matrix T is determined by a frequency of the array antenna, positions of the dipoles in the first initial reconstruction array X and positions of the N measuring points.

The first final reconstructing unit is configured to perform an iterative calculation according to a first target function $\mu_{tot}$ where parameters of the dipoles are changed in each iteration, and to obtain a first final reconstruction array X' when the $\mu_{tot}$ is less than a first preset value. The parameters of the dipoles include at least one or more selected from the number of the dipoles, the positions of the dipoles or a polarization mode of the dipoles. The first target function in this unit may be $$\mu_{tot} = \sum_{i=0}^{n} \left| \frac{F - (T_i \cdot Y_i)}{F} \right|,$$

but not limited to this. Alternatively, in order to simplify the calculation, in each iteration of this unit, relative positions among individual dipoles may remain unchanged.

The second initial reconstructing unit is configured to supplement dipoles in the total reconstruction plane on the basis of the first final reconstruction array X' to constitute a second initial reconstruction array Y.

The second transmission matrix constructing unit is configured to construct a second transmission matrix T' such that T'·Y=F, where the second transmission matrix T' is determined by the frequency of the array antenna, positions of the dipoles in the second initial reconstruction array Y and the positions of the N measuring points.

The second final reconstructing unit is configured to perform an iterative calculation according to a second target function $\mu'_{tot}$ where parameters of the dipoles are changed in each iteration, and to obtain a second final reconstruction array Y' when the $\mu'_{tot}$ is less than a second preset value. When the second preset value is less than the first preset value described in the first final reconstructing unit, the second final reconstruction array Y' is more accurate than the first final reconstruction array X'. The parameters of the dipoles include at least one or more selected from the number of the dipoles, positions of the dipoles or a polarization mode of the dipoles. The second target function in this unit may be $$\mu'_{tot} = \sum_{i=0}^{n} \left| \frac{F - (T'_i \cdot Y_i)}{F} \right|.$$

but not limited to this. Alternatively, in order to simplify the calculation, in each iteration of this unit, relative positions among individual dipoles may remain unchanged.

In embodiments of a third aspect of the present disclosure, a device for reconstructing a field source of an array antenna based on dipoles is provided. The device includes a processor; and a memory for storing instructions executable by the processor; in which the processor is configured to the method for reconstructing a field source of an array antenna based on dipoles as described above.

In embodiments of a fourth aspect of the present disclosure, there is provided a non-transitory computer-readable storage medium having stored therein instructions that, when executed by a processor of a terminal, causes the terminal to perform the method for reconstructing a field source of an array antenna based on dipoles as described above.

It should be illustrated that, the rectangular coordinate system described in embodiments of the present disclosure is only for convenience of description. Those skilled in the art will be appreciated that, the present disclosure may be implemented with other coordinate systems without affecting the substance of the present disclosure, which should fall into the protection scope of the present disclosure.

Although embodiments have been shown and described above, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for reconstructing a field source of an array antenna based on dipoles, comprising:

S1, measuring a radiation field of the array antenna at N measuring points to obtain a data matrix F, where the N measuring points are located at a radiation near-field or a radiation medium-field of the array antenna;

S2, defining a radiation aperture of the array antenna as a total reconstruction plane, and defining an aperture field of each individual array element of the array antenna as a reconstruction plane of array elements, placing at least one dipole in each reconstruction plane to constitute a first initial reconstruction array X;

S3, constructing a first transmission matrix T such that T·X=F, wherein the first transmission matrix T is determined by a frequency of the array antenna, positions of the dipoles in the first initial reconstruction array X and positions of the N measuring points;

S4, performing an iterative calculation according to a first target function $\mu_{tot}$, wherein in each iteration, parameters of the dipoles are changed and the first initial reconstruction array X is updated accordingly, and obtaining a first final reconstruction array X' when the value of $\mu_{tot}$ is less than a first preset value, wherein the first target function $\mu_{tot}$ is used to calculate the difference between the radiation field of the first initial reconstruction array X at the N measuring points and the measured data at the N measuring points, and the first preset value is an iteration termination condition determined according to accuracy requirements;

S5, supplementing dipoles in the total reconstruction plane on the basis of the first final reconstruction array X' to constitute a second initial reconstruction array Y;

S6, constructing a second transmission matrix T' such that T'·Y=F, wherein the second transmission matrix T' is determined by the frequency of the array antenna, positions of the dipoles in the second initial reconstruction array Y and the positions of the N measuring points;

S7, performing an iterative calculation according to a second target function $\mu'_{tot}$, wherein in each iteration, parameters of the dipoles are changed and the second initial reconstruction array Y is updated accordingly, and obtaining a second final reconstruction array Y' when the value of $\mu'_{tot}$ is less than a second preset value, wherein the second target function $\mu'_{tot}$ is used to calculate the difference between the radiation field of the second initial reconstruction array Y at the N measuring points and the measured data at the N measuring points, and the second preset value is an iteration termination condition determined according to accuracy requirements;

determining at least one array element where failure or error occurs according to the second final reconstruction array Y'; and performing at least one of:

repairing the at least one array element where failure or error occurs;

replacing the at least one array element where failure or error occurs; and adjusting other array elements to compensate for the at least one array element where failure or error occurs.

2. The method according to claim 1, wherein the parameters of the dipoles in S4 and S7 comprise at least one or more selected from the number of the dipoles, the positions of the dipoles or a polarization mode of the dipoles.

3. The method according to claim 1, wherein the first target function is $\mu_{tot}=$ $$\mu_{tot} = \sum_{i=0}^{n} \left| \frac{F - (T_i \cdot Y_i)}{F} \right|.$$

4. The method according to claim 1, wherein the second target function is $\mu'_{tot}=$ $$\mu'_{tot} = \sum_{i=0}^{n} \left| \frac{F - (T'_i \cdot Y_i)}{F} \right|.$$

5. The method according to claim 1, wherein in S2, one dipole is placed in the reconstruction plane of each array element to constitute the first initial reconstruction array X.

6. The method according to claim 2, wherein in S2, one dipole is placed in the reconstruction plane of each array element to constitute the first initial reconstruction array X.

7. The method according to claim 3, wherein in S2, one dipole is placed in the reconstruction plane of each array element to constitute the first initial reconstruction array X.

8. The method according to claim 4, wherein in S2, one dipole is placed in the reconstruction plane of each array element to constitute the first initial reconstruction array X.

9. The method according to claim 1, wherein in each iteration, relative positions among individual dipoles remain unchanged.

10. The method according to claim 2, wherein in each iteration, relative positions among individual dipoles remain unchanged.

11. The method according to claim 3, wherein in each iteration, relative positions among individual dipoles remain unchanged.

12. The method according to claim 4, wherein in each iteration, relative positions among individual dipoles remain unchanged.

13. A device for reconstructing a field source of an array antenna based on dipoles, comprising:

a processor; and a memory for storing instructions executable by the processor;

wherein the processor is configured to perform a method for reconstructing a field source of an array antenna based on dipoles, the method comprising:

S1, measuring a radiation field of the array antenna at N measuring points to obtain a data matrix F, where the N measuring points are located at a radiation near-field or a radiation medium-field of the array antenna;

S2, defining a radiation aperture of the array antenna as a total reconstruction plane, and defining an aperture field of each individual array element of the array antenna as a reconstruction plane of array elements, placing at least one dipole in each reconstruction plane to constitute a first initial reconstruction array X;

S3, constructing a first transmission matrix T such that T·X=F, wherein the first transmission matrix T is determined by a frequency of the array antenna, positions of the dipoles in the first initial reconstruction array X and positions of the N measuring points;

S4, performing an iterative calculation according to a first target function $\mu_{tot}$, wherein in each iteration, parameters of the dipoles are changed and the first initial reconstruction array X is updated accordingly, and obtaining a first final reconstruction array X' when the value of $\mu_{tot}$ is less than a first preset value, wherein the first target function $\mu_{tot}$ is used to calculate the difference between the radiation field of the first initial reconstruction array X at the N measuring points and the measured data at the N measuring points, and the first preset value is an iteration termination condition determined according to accuracy requirements;

S5, supplementing dipoles in the total reconstruction plane on the basis of the first final reconstruction array X' to constitute a second initial reconstruction array Y;

S6, constructing a second transmission matrix T' such that T'·Y=F, wherein the second transmission matrix T' is determined by the frequency of the array antenna, positions of the dipoles in the second initial reconstruction array Y and the positions of the N measuring points;

S7, performing an iterative calculation according to a second target function $\mu'_{tot}$, wherein in each iteration, parameters of the dipoles are changed and the second initial reconstruction array Y is updated accordingly, and obtaining a second final reconstruction array Y' when the value of $\mu'_{tot}$ is less than a second preset value, wherein the second target function $\mu'_{tot}$ is used to calculate the difference between the radiation field of the second initial reconstruction array Y at the N measuring points and the measured data at the N measuring points, and the second preset value is an iteration termination condition determined according to accuracy requirements;

determining at least one array element where failure or error occurs according to the second final reconstruction array Y'; and performing at least one of:

repairing the at least one array element where failure or error occurs;

replacing the at least one array element where failure or error occurs; and adjusting other array elements to compensate for the at least one array element where failure or error occurs.

14. The device according to claim 13, wherein the parameters of the dipoles in S4 and S7 comprises at least one or more selected from the number of the dipoles, the positions of the dipoles or a polarization mode of the dipoles.

15. The device according to claim 13, wherein the first target function is $\mu_{tot}=$ $$\mu_{tot} = \sum_{i=0}^{n} \left| \frac{F - (T_i \cdot Y_i)}{F} \right|.$$

16. The device according to claim 13, wherein the second target function is $\mu'_{tot}=$ $$\mu'_{tot} = \sum_{i=0}^{n} \left| \frac{F - (T'_i \cdot Y_i)}{F} \right|.$$

17. The device according to claim 13, wherein in S2, one dipole is placed in the reconstruction plane of each array element to constitute the first initial reconstruction array X.

18. The device according to claim 13, wherein in each iteration, relative positions among individual dipoles remain unchanged.

19. A non-transitory computer-readable storage medium having stored therein instructions that, when executed by a processor of a terminal, causes the terminal to perform a method for reconstructing a field source of an array antenna based on dipoles, the method comprising:

S1, measuring a radiation field of the array antenna at N measuring points to obtain a data matrix F, where the N measuring points are located at a radiation near-field or a radiation medium-field of the array antenna;

S2, defining a radiation aperture of the array antenna as a total reconstruction plane, and defining an aperture field of each individual array element of the array antenna as a reconstruction plane of array elements, placing at least one dipole in each reconstruction plane to constitute a first initial reconstruction array X;

S3, constructing a first transmission matrix T such that T·X=F, wherein the first transmission matrix T is determined by a frequency of the array antenna, positions of the dipoles in the first initial reconstruction array X and positions of the N measuring points;

S4, performing an iterative calculation according to a first target function $\mu_{tot}$, wherein in each iteration, parameters of the dipoles are changed and the first initial reconstruction array X is updated accordingly, and obtaining a first final reconstruction array X' when the value of $\mu_{tot}$ is less than a first preset value, wherein the first target function $\mu_{tot}$ is used to calculate the difference between the radiation field of the first initial reconstruction array X at the N measuring points and the measured data at the N measuring points, and the first preset value is an iteration termination condition determined according to accuracy requirements;

S5, supplementing dipoles in the total reconstruction plane on the basis of the first final reconstruction array X' to constitute a second initial reconstruction array Y;

S6, constructing a second transmission matrix T' such that T'·Y=F, wherein the second transmission matrix T' is determined by the frequency of the array antenna, positions of the dipoles in the second initial reconstruction array Y and the positions of the N measuring points;

S7, performing an iterative calculation according to a second target function $\mu'_{tot}$, wherein in each iteration, parameters of the dipoles are changed and the second initial reconstruction array Y is updated accordingly, and obtaining a second final reconstruction array Y' when the value of $\mu'_{tot}$ is less than a second preset value, wherein the second target function $\mu'_{tot}$ is used to calculate the difference between the radiation field of the second initial reconstruction array Y at the N measuring points and the measured data at the N measuring points, and the second preset value is an iteration termination condition determined according to accuracy requirements;

determining at least one array element where failure or error occurs according to the second final reconstruction array Y'; and performing at least one of:

repairing the at least one array element where failure or error occurs;

replacing the at least one array element where failure or error occurs; and adjusting other array elements to compensate for the at least one array element where failure or error occurs.

* * * * *